(12) United States Patent
Bagung et al.

(10) Patent No.: US 10,180,550 B2
(45) Date of Patent: Jan. 15, 2019

(54) METHOD FOR PRODUCING AN ELECTRO-OPTICAL INTERFACE, ELECTRO-OPTICAL INTERFACE, AND CONTROL UNIT

(71) Applicant: CONTINENTAL AUTOMOTIVE GMBH, Hannover (DE)

(72) Inventors: Detlev Bagung, Bernhardswald (DE); Thomas Riepl, Bad Abbach (DE)

(73) Assignee: CONTINENTAL AUTOMOTIVE GMBH, Hannover (DE)

( * ) Notice: Subject to any disclaimer, the term of this patent is extended or adjusted under 35 U.S.C. 154(b) by 0 days.

(21) Appl. No.: 15/914,415

(22) Filed: Mar. 7, 2018

(65) Prior Publication Data

US 2018/0196208 A1 Jul. 12, 2018

Related U.S. Application Data

(63) Continuation of application No. PCT/EP2016/069942, filed on Aug. 24, 2016.

(30) Foreign Application Priority Data

Sep. 8, 2015 (DE) .................. 10 2015 217 155

(51) Int. Cl.
| | |
|---|---|
| *G02B 6/42* | (2006.01) |
| *B60R 16/023* | (2006.01) |
| *H05K 1/02* | (2006.01) |
| *H05K 1/03* | (2006.01) |
| *H05K 1/18* | (2006.01) |
| *H05K 3/00* | (2006.01) |
| *H05K 3/28* | (2006.01) |
| *H05K 3/30* | (2006.01) |
| *H05K 1/14* | (2006.01) |

(52) U.S. Cl.
CPC .......... *G02B 6/4281* (2013.01); *B60R 16/023* (2013.01); *G02B 6/4274* (2013.01);
(Continued)

(58) Field of Classification Search
CPC ............... G02B 6/4281; G02B 6/4274; H05K 2201/10121; H05K 1/028; H05K 1/0393;
(Continued)

(56) References Cited

U.S. PATENT DOCUMENTS

| | | | |
|---|---|---|---|
| 2002/0041740 A1 | 4/2002 | OConnor et al. | |
| 2005/0018972 A1* | 1/2005 | Anderson | G02B 6/4249 385/53 |

(Continued)

FOREIGN PATENT DOCUMENTS

| | | |
|---|---|---|
| EP | 1429164 A2 | 6/2004 |
| WO | 2012141333 A1 | 10/2012 |
| WO | 2013158094 A1 | 10/2013 |

OTHER PUBLICATIONS

International Search Report and Written Opinion dated Nov. 14, 2016 from corresponding International Patent Application No. PCT/EP2016/069942.

(Continued)

*Primary Examiner* — Sherman Ng

(57) ABSTRACT

A method for producing a lateral connection of an electro-optical interface is specified. In the method, a printed circuit board having a non-curved center plane is provided. An electro-optical component and an electrical component are arranged and oriented with respect to one another in a connection region. A first section of the printed circuit board is deformed in such a way that the center plane encloses an angle with the non-deformed layer in the region of the first section. An electro-optical interface and a control device are also specified.

13 Claims, 1 Drawing Sheet

(52) U.S. Cl.
CPC ........... *H05K 1/028* (2013.01); *H05K 1/0278* (2013.01); *H05K 1/0393* (2013.01); *H05K 1/181* (2013.01); *H05K 3/0014* (2013.01); *H05K 3/284* (2013.01); *H05K 3/303* (2013.01); *H05K 1/148* (2013.01); *H05K 2201/10121* (2013.01); *H05K 2201/10189* (2013.01)

(58) Field of Classification Search
CPC ...... H05K 3/284; H05K 1/181; H05K 3/0014; H05K 1/0278; H05K 1/148
USPC .......................................... 174/254; 361/749
See application file for complete search history.

(56) References Cited

U.S. PATENT DOCUMENTS

| | | |
|---|---|---|
| 2005/0249450 A1 | 11/2005 | Schrodinger |
| 2006/0257081 A1 | 11/2006 | Ishigami et al. |
| 2009/0097802 A1* | 4/2009 | Tamura ................ G02B 6/4201 385/85 |
| 2010/0183267 A1* | 7/2010 | Becht .................. G02B 6/4246 385/88 |
| 2012/0237159 A1 | 9/2012 | Tsujita et al. |
| 2012/0266434 A1 | 10/2012 | Yu et al. |
| 2014/0036218 A1 | 2/2014 | Yu |
| 2014/0099123 A1 | 4/2014 | Kang et al. |
| 2014/0120749 A1* | 5/2014 | Drew .................... H01R 12/71 439/78 |
| 2014/0212086 A1* | 7/2014 | Sunaga ................. G02B 6/428 385/14 |
| 2014/0284463 A1 | 9/2014 | Kuroda et al. |
| 2016/0254604 A1* | 9/2016 | Loibl .................... H05K 1/147 439/65 |

OTHER PUBLICATIONS

German Office Action dated May 6, 2016 for corresponding German Patent Application No. 10 2015 217 155.8.

* cited by examiner

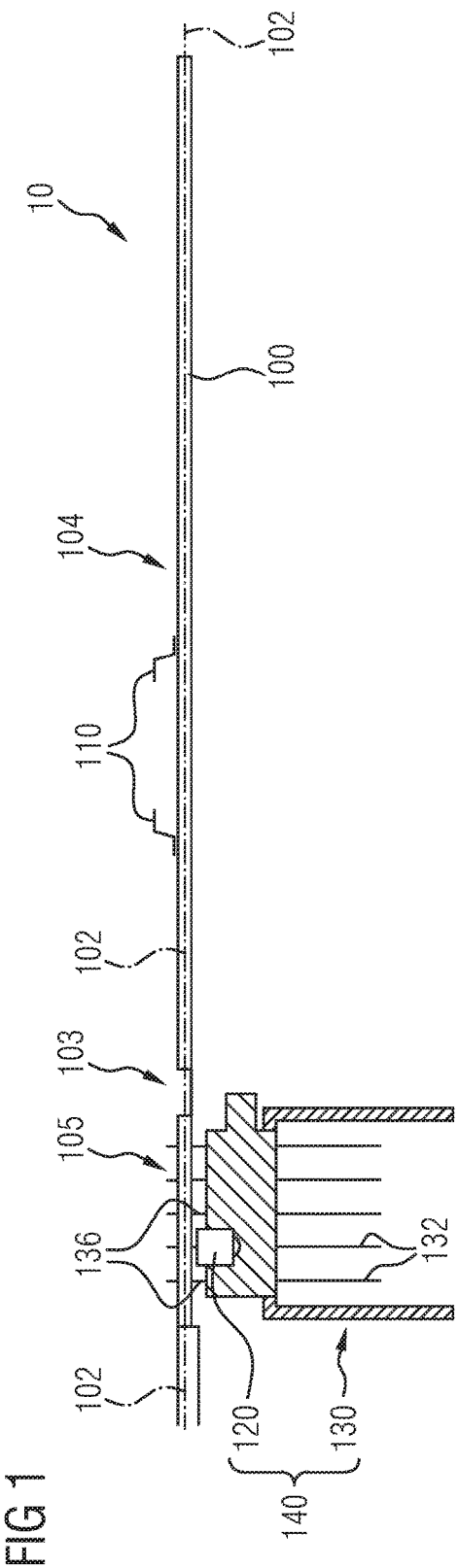
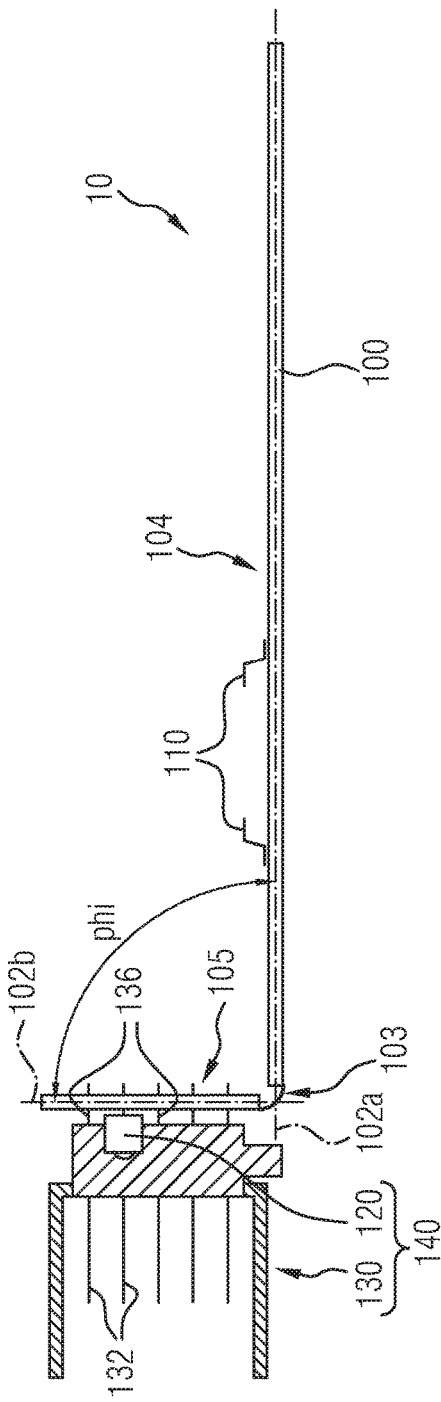

METHOD FOR PRODUCING AN ELECTRO-OPTICAL INTERFACE, ELECTRO-OPTICAL INTERFACE, AND CONTROL UNIT

CROSS REFERENCE TO RELATED APPLICATIONS

This application claims the benefit of PCT Application PCT/EP2016/069942, filed Aug. 24, 2016, which claims priority to German Patent Application 10 2015 217 155.8, filed Sep. 8, 2015. The disclosures of the above applications are incorporated herein by reference in their entirety.

FIELD OF INVENTION

The invention relates to a method for producing a lateral connection of an electro-optical interface, in particular for a control device in a vehicle. The present invention furthermore relates to an electro-optical interface and to a control device, in particular in a ByteFlight bus system of a vehicle, having an electro-optical interface.

BACKGROUND

Electro-optical interfaces produce the electrical and optical connections between the circuit on a printed circuit board and electrical and optical supply and signal lines, for example using the cable harness of a vehicle.

SUMMARY

It is an object of the present disclosure to specify a method for producing a lateral connection of an electro-optical interface that permits particularly simple manufacture. It is a further object of the present disclosure to specify a structurally and functionally advantageous electro-optical interface.

A method for producing a lateral connection of an electro-optical interface is specified. In particular, the method is a method for producing an electro-optical interface having a lateral connection. The interface is provided, in particular, for a control device in a vehicle. In the method, an opto-electronic assembly having the electro-optical interface is produced.

In one step of the method, a printed circuit board is provided, which has a substantially non-curved center plane, wherein a non-deformed layer is defined by the center plane. In other words, the printed circuit board has a connection region and a main region, and, in particular, a bending region between the connection region and the main region. When providing the printed circuit board, a center plane of the connection region and a center plane of the main region are parallel to one another and, in particular, coplanar. The printed circuit board has electrical conductor tracks for conveying electrical signals. In one development, the printed circuit board additionally has optical conductor tracks for conveying optical signals.

In a further, in particular subsequent, method step, an electro-optical component is arranged in the connection region of the printed circuit board. An electrical component is also arranged in the connection region. The electro-optical component and the electrical component are oriented with respect to one another. The orienting may be carried out, for example, at the same time as the assembly of the electrical component, for example by inserting the already assembled electro-optical component into a depression in the electrical component, the depression being provided for receiving the electro-optical component.

In a further method step, in particular subsequent to the assembly and orienting of the electrical and the electro-optical component, a bending region of the printed circuit board is deformed in such a way that, after the deforming, the center plane encloses an angle phi with the non-deformed layer in the region of the connection section, wherein phi is expediently not a straight angle. In other words, the center plane of the connection region and the center plane of the main region are tilted toward one another by the deforming, with the result that they enclose an angle phi, which is expediently different from 180°. In an expedient refinement, the main region and the connection region remain planar during deforming whereas the bending region is curved by the deforming.

The method, according to embodiments of the invention, is distinguished in that the desired orientation of the connection is achieved by a deforming process of the printed circuit board, which is planar in the initial state. The deforming may advantageously take place after assembly of the components. The use of angled connection pins for the electrical and/or the electro-optical component is advantageously not necessary to achieve the lateral connection—that is to say an orienting of the interface parallel to the non-deformed layer or to the center plane of the main region. In this way, particularly small lateral spacings of the connection pins and/or particularly simple and cost-effective production are possible. The space requirement of the interface is particularly low. The use of special components—as in the case of a planar printed circuit board—is not necessary to realize the lateral connection.

The angle phi between the deformed, in particular angled, region of the printed circuit board and the original layer of the printed circuit board may, in principle, be selected arbitrarily. In an embodiment, the angle phi has a value between 10° and 170°, between 50° and 120°, particularly between 80° and 100°. After deforming, the connection region and the main region of the printed circuit board may be particularly perpendicular to one another.

In one embodiment, the bending region is formed by a material weakness in the printed circuit board. The printed circuit board may be a semi-flexible printed circuit board in which a rigid carrier material extends in one piece from the connection region via the bending region into the main region of the printed circuit board and the semi-flexibility is achieved, in particular, by the reduced material strength of the carrier material in the bending region. In particular, the bending region of the semi-flexible printed circuit board is in this way so rigid that the orienting of the connection region with respect to the main region does not change on account of the force of gravity. In another embodiment, the bending region is defined by the arrangement of a flexible material. It is also conceivable to select the material in the entire region of the printed circuit board in such a way that the bending region may be positioned at any location of the printed circuit board.

The method, according to embodiments of the invention, makes it possible to use, in particular, a surface-mountable component (SMD, e.g., a surface mounted device) as the electro-optical component. These standardized components are available at a low cost and may be handled and installed significantly more easily than, for example, electro-optical components having bent connection pins.

In one embodiment, the electro-optical component has a light-emitting diode and/or a photodiode. In a further embodiment, the electrical component is a plug. In this case, the orienting step may include the electro-optical component being oriented in such a way that light emerging from and/or received by the electro-optical component is guided through the plug. The electrical component may in this case be configured, in particular, as a solder plug or as a press-fit plug, since the method does not involve any restriction at all in this regard when configuring the plug. This is regarded as a particular advantage of the invention. A "press-fit plug" is in this case a plug having connection pins which are configured for pressing into metallized openings in the printed circuit board, wherein, in particular, the electrical connection between the connection pins and the printed circuit board is produced in a solder-free manner during pressing-in.

The method, according to embodiments of the invention, may be used, for example, in the production of an electro-optical interface, which is a constituent part of a control device, in particular in a ByteFlight bus system. The so-called "ByteFlight bus system" is, in particular, a standard bus system known to those skilled in the art for safety-critical applications in automotive technology. The Byte-Flight bus system has, in particular, a data rate of 10 Mbit/s and may use optical polymer fibers as transmission medium. ByteFlight is typically a network in star topology having an intelligent star coupler. Like the CAN bus, ByteFlight operates, in particular, using a message-oriented transmission protocol: all messages are provided to all ByteFlight stations. The data packets (frames) are then similar to CAN data packets; the maximum length of the data field is 12 bytes. In order to achieve a predictable real-time response, ByteFlight may expediently operate using the deterministic access method TDMA in which each connected bus station receives a defined time slot for the data transmission within a determined time.

In accordance with a further aspect, an electro-optical interface, in particular for a control device of a vehicle, is specified. The interface has a printed circuit board, wherein the printed circuit board has at least one connection region and one main region. The printed circuit board has electrical conductor tracks for conveying electrical signals. In one development, the printed circuit board additionally has optical conductor tracks for conveying optical signals.

In addition, the electro-optical interface has at least one electro-optical component and at least one electrical component. The electrical component is connected to at least one electrical conductor track. In one embodiment, the electro-optical component is connected to at least one optical conductor track and an electrical conductor track. The electro-optical component may be configured to receive electrical signals and to send optical signals and/or to receive optical signals and to send electrical signals. To send and receive the electrical signals, the electro-optical component may be connected to an electrical conductor track of the printed circuit board.

The electro-optical component and the electrical component are connected to the printed circuit board and oriented with respect to one another in the connection region, wherein a center plane of the printed circuit board in the connection region encloses an angle phi different from 180° with a center plane of the printed circuit board in the main region. In one embodiment, the angle phi has a value between 10° and 170°, between 50° and 120°, particularly between 80° and 100°.

In one embodiment, the electro-optical component is a surface-mounted component (SMD, e.g., a surface mounted device), which has, in particular, a light-emitting diode and/or a photodiode. In one embodiment, the electrical component is a plug. The plug and the electro-optical component may be oriented with respect to one another in such a way that light emerging from and/or received by the electro-optical component is guided through the plug. A solder plug or a press-fit plug may in turn be used as the electrical component.

In accordance with a third aspect, a control device, in particular an electronic control device of a motor vehicle, is provided. Such control device may be a control device in a ByteFlight bus system of a vehicle. The control device has a housing and an electro-optical interface arranged in the housing, in particular in accordance with at least one of the above embodiments in connection with the interface or the production methods thereof.

In one embodiment, the housing is closed in a fluid-tight manner. In one development, the housing is closed in a hermetically sealed manner.

In one embodiment of the method, of the interface or of the control device, a sealing element is arranged between the electrical component and the printed circuit board and/or between the electro-optical component and the printed circuit board, the sealing element contributing, in particular, to the fluid-tight sealing of the control device. The sealing element may be an insert seal or may be a sealing element sprayed directly onto the electrical component and/or onto the electro-optical component.

BRIEF DESCRIPTION OF THE DRAWINGS

Further features, application possibilities and advantages of the method, of the interface and of the control device emerge from the following description of the embodiments, which are illustrated in the figures.

In the figures:

FIG. 1 shows a manufacturing stage during the production of an electro-optical interface in accordance with an embodiment; and FIG. 2 shows an electro-optical interface 10 according to the invention, produced in accordance with the method according to the invention.

DETAILED DESCRIPTION

In the figures, the same reference numerals are used for identical elements. The figures and the size ratios of the elements illustrated in the figures with respect to one another are not to be seen as true to scale. Instead, individual elements may be illustrated with an exaggerated size for better illustration and/or for better understanding.

FIG. 1 shows a manufacturing stage during the production of an electro-optical interface 10 in accordance with the method according to the invention.

The electro-optical interface 10 has a printed circuit board 100, on which components 110 and electrical conductor tracks (not illustrated) are arranged. The printed circuit board 100 is a disk-like component having a (in the provision step) substantially non-curved, planar center plane 102. In the present case, the printed circuit board 100 is a semi-flexible printed circuit board having a main region 104, a connection region 105 and a bending region 103 of reduced carrier material strength, which is arranged between the connection region 105 and the main region 104 and extends from one of the side edges up to the opposite side edge of the printed circuit board 100. The main region 104 may be populated with the components 110 or at least with the majority of the components 110. For example, a microcontroller is arranged on the main region.

In the method, an electro-optical interface 10 is produced which has an electro-optical plug device 140. To this end, in the illustrated manufacturing stage, an electro-optical component 120 and an electrical component, namely a plug 130, have already been mounted on the printed circuit board 100 in the connection region 105 of the printed circuit board 100 in such a way that the electro-optical component 120 and the electrical plug 130 are oriented with respect to one another in such a way that the electro-optical component 120 may emit light through the electro-optical plug device 140. The electro-optical component 120 is in this case a standardized surface-mounted component, which has a light-emitting diode. During assembly of the plug 130, the electro-optical component 120 is in the present case received in a recess of a plastic housing of the plug 130, wherein the shape of the recess is adapted to the design of the electro-optical component 120 and in this way is oriented with respect to the plug 130.

The electro-optical component 120 is configured with at least one of the conductor tracks (not shown) for receiving an electrical signal by way of the printed circuit board 100 and, by means of the light-emitting diode provided for converting the electrical signal into a light signal, provided for conveying via the electro-optical plug 140—for example to an optical line of a cable harness. Furthermore, the electrical plug 130 is connected to at least one or more further electrical conductor tracks (not illustrated) for conveying an electrical signal from the printed circuit board 100 via the electro-optical plug device 140—for example to an electrical line of the cable harness.

The electrical plug 130 has straight connection pins 136, which, for the purpose of producing the electrical contact, are connected to the at least one electrical conductor track and, for the purpose of mechanical fixing of the plug 130 by pressing-in (press fit), are connected to the printed circuit board 100. As an alternative to this, a soldered connection may also be used. A sealing element (not illustrated in the figures) may be arranged between the electrical component 130 and the printed circuit board 100, and/or between the electro-optical component 110 and the printed circuit board 100, and/or between the electrical component 130 and the electro-optical component 120. The sealing element or the sealing elements may in this case be an insert seal or may be a seal sprayed directly onto the electrical component 130 and/or onto the electro-optical component 120.

Furthermore, FIG. 1 shows a semi-flexible bending region 103, which in the present case has been produced by a material weakness in the one-piece carrier material of the printed circuit board 100 in the relevant region. The bending region 103 separates the connection region 105 from the main region 104 and extends perpendicularly to the plane of the drawing along the connection region 105. Both the main region 104 and the connection region 105 of the printed circuit board 100 are planar and thus oriented with respect to one another in such a way that, in the present method stage, the center plane 102 of the entire printed circuit board 100 runs in a planar and non-curved manner. In other words, the connection region 105 and the main region 104 have coplanar center planes 102a, 102b, represented by the common center plane 102.

FIG. 2 shows the electro-optical interface 10 in accordance with the method step of deforming the bending region 103. In this method step, the bending region 103 is bent around a bending axis parallel to the main direction of extent of the bending region 103 in such a way that, after deforming, a center plane 102b of the connection section 105 encloses an angle phi with the center plane 102 of the main section 104. In the illustrated example, the angle phi has a value of 90°, but it may also have a different value between 10° and 170°, between 50° and 120°, and particularly between 80° and 100°.

FIG. 2 shows that the electro-optical plug device 140 is a lateral plug outlet. This means, in particular, that the plug direction of the plug 130 is parallel to the center plane 102b of the main region 104 of the printed circuit board. In the finished state of the interface 10, the connection pins 136 of the plug are likewise parallel to the center plane 102a of the main region 104. The connection pins are also arranged perpendicular to the center plane 102b of the connection section 105.

A control device in a ByteFlight bus system of a vehicle may have a housing (not illustrated in the figures) and an electro-optical interface 10 arranged in the housing, wherein the housing is closed in a fluid-tight manner.

The invention is not restricted to the exemplary embodiments by the description thereof. Instead, the invention includes each new feature and each combination of features, which contains, in particular, each combination of features in the exemplary embodiments and patent claims.

Those skilled in the art can now appreciate from the foregoing description that the broad teachings of the disclosure may be implemented in a variety of forms. Therefore, while this disclosure includes particular examples, the true scope of the disclosure should not be so limited since other modifications will become apparent to the skilled practitioner upon a study of the drawings, the specification, and the following claims.

The invention claimed is:

1. A method for producing a lateral connection of an electro-optical interface for a control device in a vehicle, the method comprising: providing a printed circuit board which has a non-curved, planar center plane, wherein a non-deformed layer is defined by the center plane; arranging an electro-optical component in a connection region of the printed circuit board; arranging an electrical component in the connection region and orienting the electro-optical component and the electrical component with respect to one another; inserting the electro-optical component into a depression in the electrical component, the depression being provided for receiving the electro-optical component; and deforming, by bending, a bending region of the printed circuit board in such a way that, after the deforming, the center plane encloses an angle with the non-deformed layer in the region of the connection region, wherein the angle has a value between 10° and 170°, wherein the electrical component is a plug, and the orienting step comprises orienting the electro-optical component in such a way that light, which is at least one of emerging from and received by the electro-optical component, is guided through the plug, wherein the electro-optical component is a surface-mounted component, the electro-optical component comprises a diode, and wherein the electrical component is configured as a solder plug or as a press-fit plug.

2. The method as claimed in claim 1, wherein the angle has a value between 50° and 120°.

3. The method as claimed in claim 1, wherein the angle has a value between 80° and 100°.

4. The method as claimed in claim 1, wherein the deforming takes place in the bending region which is defined by a material weakness in the printed circuit board or by an arrangement of a flexible material.

5. An electro-optical interface for a control device of a vehicle, comprising: a printed circuit board, wherein the printed circuit board has at least one connection region and a main region; at least one electro-optical component; and at least one electrical component, wherein the at least one electro-optical component and the at least one electrical component are connected to the printed circuit board and oriented with respect to one another in the connection region, wherein a center plane of the printed circuit board in the connection region encloses an angle with a center plane of the printed circuit board in the main region, wherein the angle has a value between 10° and 170°, wherein the electro-optical component is a surface-mounted component, the electro-optical component comprises a diode, the electrical component is a plug, the electro-optical component is received in a recess of the plug, the plug and the electro-optical component are oriented in such a way that light, which at least one of emerging from and received by the electro-optical component, is guided through the plug, and wherein the electrical component is a solder plug or a press-fit plug.

6. The electro-optical interface as claimed in claim 5, wherein the angle has a value between 50° and 120°.

7. The electro-optical interface as claimed in claim 5, wherein the angle has a value between 80° and 100°.

8. The electro-optical interface as claimed in claim 5, further comprising a sealing element arranged at least one of between the electrical component and the printed circuit board and between the electro-optical component and the printed circuit board.

9. The electro-optical interface as claimed in claim 8, wherein the sealing element is an insert seal or a sprayed layer directly on at least one of the electrical component and the electro-optical component.

10. The electro-optical interface as claimed in 5, wherein the control device is at least part of a ByteFlight bus system.

11. A vehicle control device, comprising: a housing; and an electro-optical interface arranged in the housing, the electro-optical interface comprising a printed circuit board, wherein the printed circuit board has at least one connection region and at least one main region; at least one electro-optical component; and at least one electrical component, wherein the at least one electro-optical component and the at least one electrical component are connected to the printed circuit board and oriented with respect to one another in the at least one connection region, wherein a center plane of the printed circuit board in the at least one connection region forms an angle with a center plane of the printed circuit board in the at least one main region, wherein the angle has a value between 10° and 170°, wherein the electro-optical component is a surface-mounted component, the electro-optical component comprises a diode, the electrical component is a plug, the electro-optical component is received in a recess of the plug, and the plug and the electro-optical component are oriented in such a way that light, which is at least one of emerging from and received by the electro-optical component, is guided through the plug, the plug being one of a solder plug and a press-fit plug.

12. The vehicle control device as claimed in claim 11, wherein the housing of the control device is closed in a fluid-tight manner.

13. The vehicle control device as claimed in claim 11, wherein the vehicle control device forms at least part of a ByteFlight bus system.

* * * * *